United States Patent [19]

Wheeler et al.

[11] Patent Number: 4,458,163

[45] Date of Patent: Jul. 3, 1984

[54] PROGRAMMABLE ARCHITECTURE LOGIC

[75] Inventors: Glenn Wheeler; James Ptasinski, both of Dallas, Tex.

[73] Assignee: Texas Instruments Incorporated, Dallas, Tex.

[21] Appl. No.: 284,431

[22] Filed: Jul. 20, 1981

[51] Int. Cl.³ ............... H03K 17/60; H03K 19/086
[52] U.S. Cl. ............................ 307/466; 307/454; 364/716
[58] Field of Search .................. 307/465–467, 307/445, 454; 357/51; 364/716; 365/96, 104

[56] References Cited

U.S. PATENT DOCUMENTS

| 3,987,287 | 10/1976 | Cox et al. | 307/465 X |
| 4,041,459 | 8/1977 | Horninger | 307/463 X |
| 4,157,480 | 6/1979 | Edwards | 307/465 |
| 4,207,556 | 6/1980 | Sugiyama et al. | 365/96 X |
| 4,240,094 | 12/1980 | Mader | 307/465 X |

OTHER PUBLICATIONS

Larson and Downey, "Field Programmable Logic Devices", Electronic Engineering, 1-1980, pp. 37–54.

Texas Instruments Incorporated, 1981 Supplement to the TTL Data Book, p. 316.

Primary Examiner—Larry N. Anagnos
Assistant Examiner—David R. Hudspeth
Attorney, Agent, or Firm—Douglas A. Lashmit; Melvin Sharp; N. Rhys Merrett

[57] ABSTRACT

A programmable logic device is disclosed which contains additional circuitry allowing the architecture to be programmed. Operating as an input circuit or as an output circuit, the logical function of the device is selected to operate as a buffer, latch or register. When fabricated as a portion of a programmable logic array, the architecture is modified to the desired configuration by fusible connections which conduct normal operating current until overloaded by selective programming. Thereafter, the data path through the array is programmed in a normal fashion. The programmable architecture circuitry is readily fabricated in an integrated circuit form in conjunction with a programmable logic array.

8 Claims, 2 Drawing Figures

PROGRAMMABLE ARCHITECTURE LOGIC

BACKGROUND OF THE INVENTION

Programmable logic devices have received wide acceptance in the automated data processing industry due primarily to the flexibility afforded the engineer in utilizing a single device to fulfill a variety of requirements. This is accomplished by the use of a programmable data path structure in which the engineer "blows" fusible links to isolate certain data paths leaving the selected data paths operable.

A wide variety of these devices is available with variations in their design and application to various requirements. However, they do have the feature in common that they will use a single logic operation circuit with a multitude of data paths connected to that single circuit. In programming one selects the data path output or input to the device required in an application and intentionally blows the fuse or "programs" the device so that the proper data path is then selected. See the article entitled "Field Programmable Logic Devices" by T. L. Larson and C. Downing, Electronic Engineering, January 1980, pp 37, for further background.

Although there is currently a variety available, one still must select a programmable device having the proper input and output configuration such as buffer, register, or latch, for his particular requirement. Furthermore, it is only by the selection of data paths internal to the programmable device that the data may be directed such that the logic function is properly performed.

An alternative to data path programming is data input programming using fusible links to permanently determine an input signal condition in a high or low state. An example of this type of programming option is shown in the Texas Instruments Incorporated, 1981 Supplement to the TTL Data Book, at page 316. The circuitry at connections 9, 10, and 11, and at 14, 15, and 16, on that page, operate as exclusive OR gates with one input selectable to operate either in a high state, or low state after programming, for the purpose of changing the operation of the OR gate. The OR gate circuitry is, however, unaffected. The actual data is programmed in this alternative, and thus, the application of this technique is limited to those devices having very few inputs, usually two.

A further drawback is the requirement that a large number of data paths must be provided on the circuit even though they will not all be in use subsequent to programming of the device. As a consequence, a large surface area of the chip is dedicated to inoperable data lines on the device.

Accordingly, it is an object of the present invention to provide a programmable logic device having architecture selectable by the user.

A further object of the present invention is to provide a programmable logic device having a single data path wherein the logical operative function of the device is programmed.

SUMMARY AND BRIEF DESCRIPTION OF THE INVENTION

In accordance with the present invention an integrated circuit is disclosed having at least one data input and at least one data output which comprises an alterable logic network connected between the input and the output capable of performing a selected logic operation of a plurality of logic operations, and circuitry operatively connected to the logic network for permanently selecting a particular logic operation from the plurality of logic operations.

The plurality of logic operations includes registering data in response to a clocking signal, buffering data signals, and latching data signals in response to an enable signal.

Furthermore, the circuit may be connected to additional logic circuitry having a predetermined operation wherein the predetermined logic circuitry is capable of receiving data from a selected path of a plurality of data paths or transmitting data to a selected path of a plurality of data paths when programmed.

In an alternative embodiment, the plurality of logic operations further includes a function switching circuit. In this configuration the operation of an AND, OR, NOR, NAND, or other functional switching circuits may be selected from the plurality of operations.

A combination of the present invention and a plurality of data paths comprise a programmable logic array having programmable architecture.

Other objects and features of the invention will become more readily understood from the following detailed description when read in conjunction with the appended claims and the accompanying drawings in which:

DETAILED DESCRIPTION OF THE DRAWINGS

Figure 1:
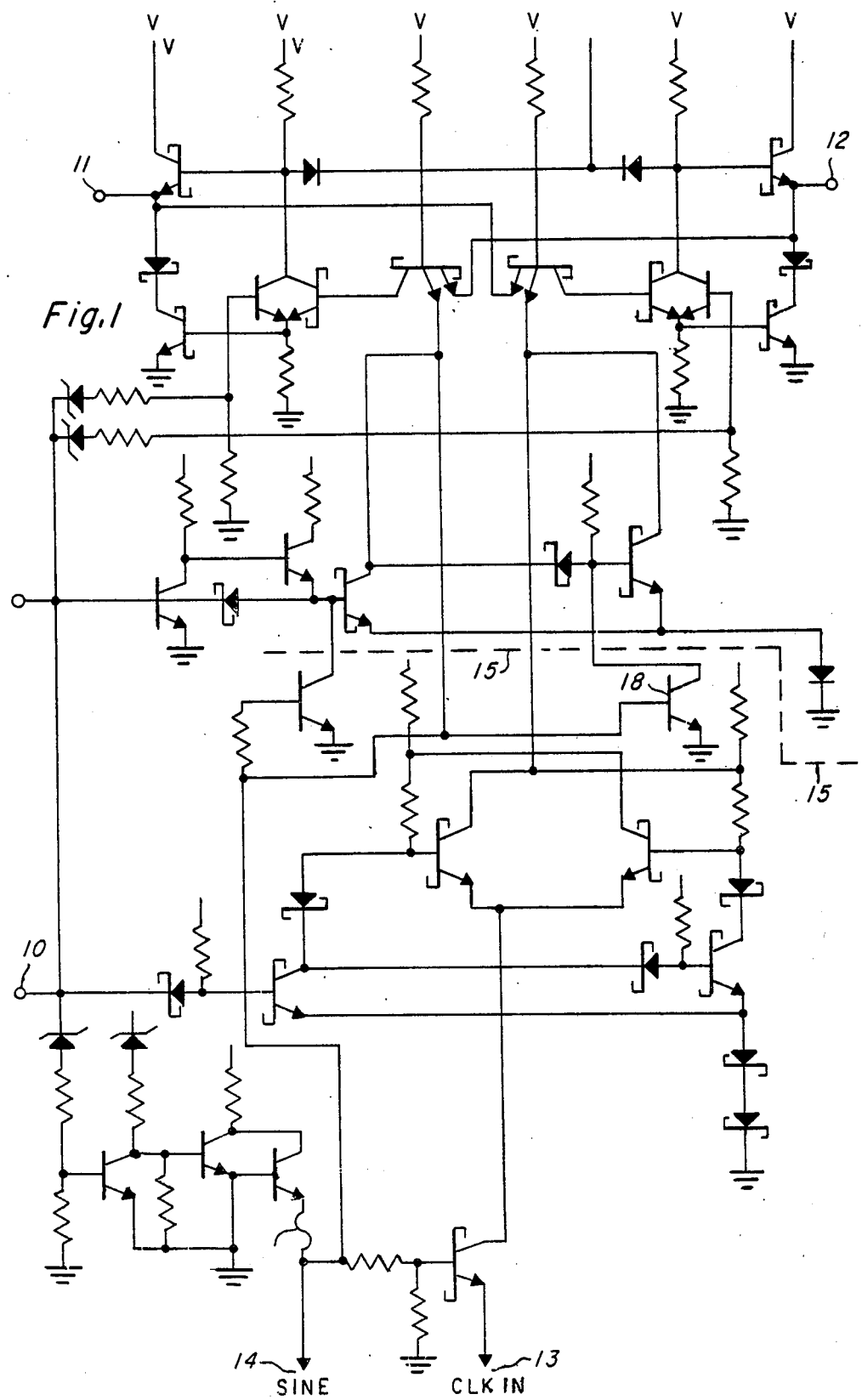
FIG. 1 is a schematic diagram of a circuit comprising a portion of a programmable logic array circuit according to the present invention. Normally operating as a register, the circuit may be programmed to operate as a buffer.

In FIG. 1 a schematic diagram representing a circuit according to the present invention is shown as it is built upon an integrated circuit chip. The circuit operates as a register with fuse 19 intact. A data signal is input at connection 10 and is registered by that circuitry shown below section line 15. Outputs 11 and 12 provide further connections into subsequent logic devices. Connection 11 provides a signal output. Connection 12 provides a complement signal output. Register output lines 16 are connected to the buffer circuitry shown above section line 15 so that signal input at 10 is registered and thereafter transferred to the buffer circuitry upon input of clock signal at 13. Thus with fuse 19 intact, the circuit shown in FIG. 1 operates as a conventional register.

When programming the circuit in FIG. 1 as a buffer, a series of steps are followed resulting in blowing fuse 19, thus isolating the register portion of the circuitry below section line 15 from the buffer circuitry. This is accomplished by first applying a high Vcc, normally on the order of twice the operating voltage, then applying a programming voltage signal at 10. The sink circuitry at 14 also is turned on with a programming voltage. This results in the destruction of the electrical conductivity of fuse 19 and allows transistors 17 and 18 to remain in the off state, which allows the buffer circuitry to operate as a buffer.

Figure 2:
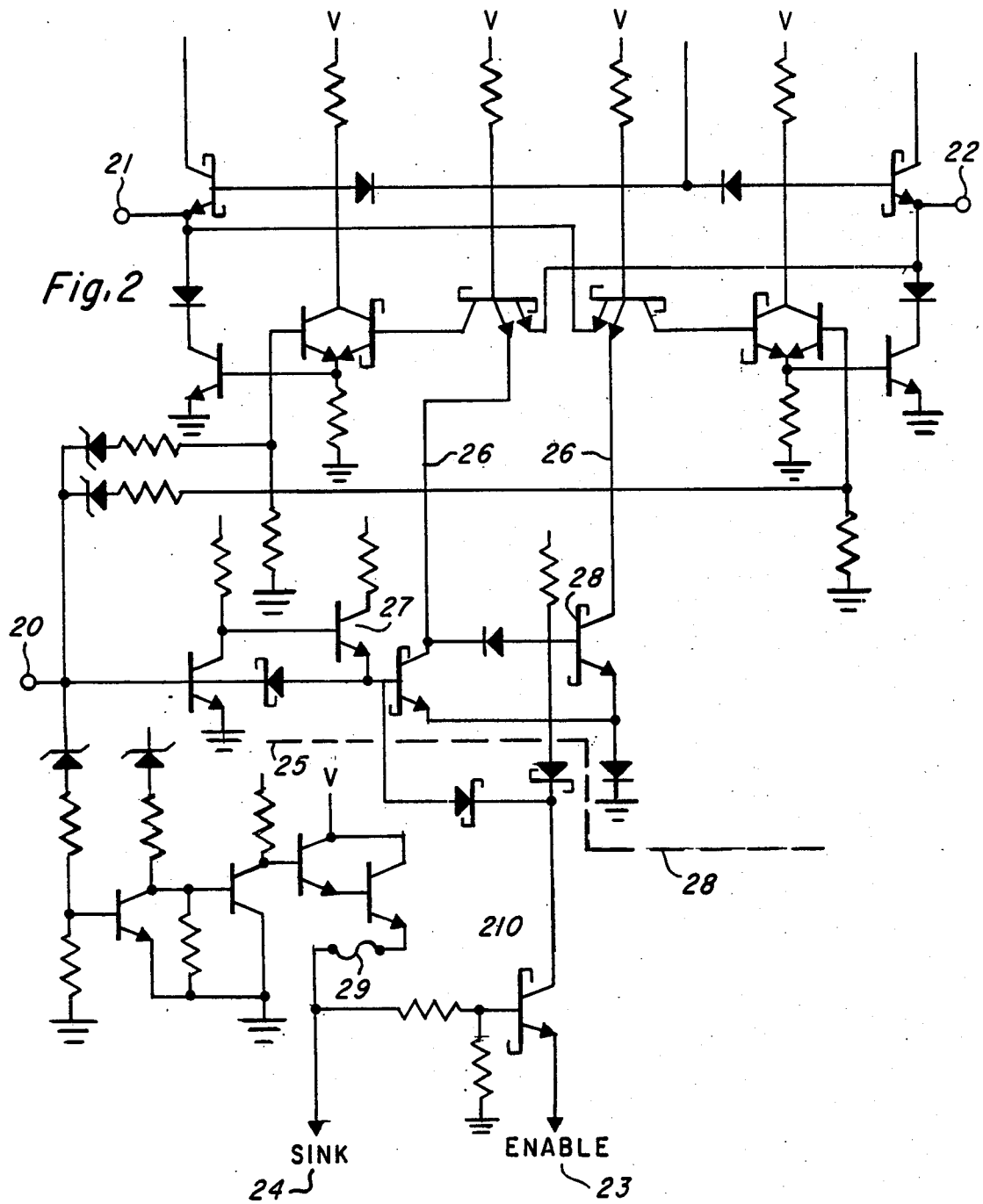
FIG. 2 is a schematic diagram of a circuit comprising a portion of a programmable logic array circuit according to another embodiment of the present invention. Normally operating as a latch, the circuit may be programmed to operate as a buffer.
Figure 3:
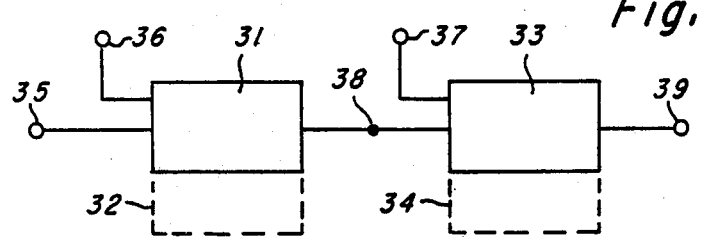

In FIG. 2 a schematic diagram with circuitry as it is built upon an integrated circuit chip is shown. In the preprogrammed state, fuse 29 is intact and the circuit in FIG. 2 functions as a latch. A data signal input at 20 is latched in when enabled by an enable signal at 23 and is held in the buffer circuitry above section line 25 providing an output at 21 and complement output at 22 for further relation in the device. When programmed to operate as a buffer, the $V_{cc}$ power voltage is operate as a buffer, the Vcc power supply voltage is increased to approximately twice the normal operating voltage. The signal at 20 and the sink circuitry at 24 turned on with a programming voltage. This results in sufficient blows fuse 29 and prevents further electrical conduction. With the circuit enable transistors base tied to ground, transistor 210 remains off and enabling signals for latching at 23 will have no further effect on the circuitry. Transistors 27 and 28 are allowed to float without interfering with the buffer circuitry above section line 25 when the latch circuitry below section line 25 is disabled, causing the circuit to operate operation of the system. This results in the operation of as a buffer.

The data path input at 20 in FIG. 2 and out at 21 and 22 remains essentially the same and the operation of the circuitry upon the data in the directly transferring, temporarily storing, or transferring and temporarily storing the data is changed as a function of programming of the circuitry.

An alternative embodiment incorporates a register which may be fusibly programmed to operate as a latch or as a buffer and a further alternative embodiment operates as a buffer which is programmed by blowing a fuse to operate as a register a latch.

The present invention is useful as input circuitry or on programmable logic arrays and on programmable gate arrays, thus providing additional flexibility in matching a device to a particular requirement.

While the principles of this invention have been described in connection with specific circuits, it is to be understood that this description is made only by way of example and not as a limitation to the scope of the invention. The disclosed invention may also be used as a discrete programmable register, latch, buffer or as a discrete programmable functional logic circuit. Numerous other circuits using this invention may be devised by those skilled in the art. For example, logic sequencers, programmable multiplexers and other programmable devices can use the present invention to good advantage without departing from the spirit and scope of the appended claims.

What is claimed is:

1. An integrated circuit having at least one data input and at least one data output comprising:
   an alterable logic network connected intermediate said input and said output for performing a selected logic operation of a plurality of logic operations; and
   circuitry operatively connected to said alterable logic network to permanently configure said alterable logic network, wherein said alterable logic network is configured to periodically register input data applied to said input prior to alteration by said permanent configuration circuitry.

2. The integrated circuit of claim 1 wherein said alterable logic network is configured to buffer input data subsequent to alteration.

3. The integrated circuit of claim 2 wherein said alterable logic network and said permanent configuration circuitry are included in a programmable logic array.

4. The integrated circuit of claim 3 wherein said alterable logic network and said permanent configuration circuitry are included in a gate array.

5. An integrated circuit having at least one data input and at least one data output comprising:
   an alterable logic network connected intermediate said input and said output for performing a selected logic operation of a plurality of logic operations; and
   circuitry operatively connected to said alterable logic network to permanently configure said alterable logic network, wherein said alterable logic network is configured to latch input data applied to said input prior to alteration by said permanent configuration circuitry.

6. The integrated circuit of claim 5 wherein said alterable logic network is configured to buffer input data subsequent to alteration.

7. The integrated circuit of claim 6 wherein said alterable logic network and said permanent configuration circuitry are included in a programmable logic array.

8. The integrated circuit of claim 7 wherein said alterable logic network and said permanent configuration circuitry are included in a gate array.

* * * * *